(12) United States Patent
Acar et al.

(10) Patent No.: US 12,740,425 B2
(45) Date of Patent: Sep. 15, 2026

(54) RF PACKAGE AND METHOD OF MANUFACTURE OF AN RF PACKAGE

(71) Applicant: NXP B.V., Eindhoven (NL)

(72) Inventors: Mustafa Acar, Eindhoven (NL); Paul Mattheijssen, Boxtel (NL); Philipp Franz Freidl, Weurt (NL); Rajesh Mandamparambil, Eindhoven (NL); Jan Willem Bergman, Veghel (NL)

(73) Assignee: NXP B.V., Eindhoven (NL)

( * ) Notice: Subject to any disclaimer, the term of this patent is extended or adjusted under 35 U.S.C. 154(b) by 708 days.

(21) Appl. No.: 18/315,515

(22) Filed: May 11, 2023

(65) Prior Publication Data

US 2023/0402410 A1 Dec. 14, 2023

(30) Foreign Application Priority Data

Jun. 13, 2022 (EP) .................................... 22178737

(51) Int. Cl.

*H01L 23/66* (2006.01)
*H01L 25/16* (2023.01)
*H10W 44/20* (2026.01)
*H10W 90/00* (2026.01)

(52) U.S. Cl.

CPC ........... *H10W 44/20* (2026.01); *H10W 90/00* (2026.01); *H10W 44/226* (2026.01)

(58) Field of Classification Search

CPC .... H10W 44/20; H10W 44/226; H10W 90/00
See application file for complete search history.

(56) References Cited

U.S. PATENT DOCUMENTS 7,408,520 B2 8/2008 Durham et al.
8,159,223 B2 4/2012 Luekeke et al.
8,350,695 B2 1/2013 Loen
2003/0100200 A1 5/2003 Franzon et al.
2012/0056787 A1 3/2012 Tatarnikov et al.
2012/0086114 A1 4/2012 Zhao et al.
2013/0082363 A1* 4/2013 Zhao ........................ H05K 1/00 257/659
2016/0056544 A1* 2/2016 Garcia ................. H01Q 9/0407 343/725
2018/0084637 A1* 3/2018 Ueda ................... H05K 1/0218
2020/0091584 A1 3/2020 Tezuka
2023/0101577 A1 3/2023 Yong

FOREIGN PATENT DOCUMENTS

CN 111509403 A 8/2020
CN 111710961 A 9/2020

* cited by examiner

*Primary Examiner* — Peniel M Gumedzoe

(57) ABSTRACT

An RF package assembly includes a stacked package-on-package arrangement of a first substrate and a second substrate. Each of the first and second substrates include RF signal pads and ground pads. An interface region between the stacked substrates couples the RF signal pads and ground pads of the first substrate to corresponding pads of the second substrate. The interface region includes galvanic connection regions providing a galvanic connection between the each of the first substrate ground pads and each of the corresponding second substrate ground pads. The interface region includes dielectric regions between each of the first substrate RF signal pads and the corresponding second substrate RF signal pads so that RF signals transmitted between the two substrates are capacitively coupled.

20 Claims, 5 Drawing Sheets

RF PACKAGE AND METHOD OF MANUFACTURE OF AN RF PACKAGE

CROSS-REFERENCE TO RELATED APPLICATIONS

This application claims the priority under 35 U.S.C. § 119 of European patent application no. 22178737.7, filed 13 Jun. 2022, the contents of which are incorporated by reference herein.

FIELD

This disclosure relates to a Radio Frequency (RF) package and method of manufacture of an RF package.

BACKGROUND

Radio-frequency (RF) packages include RF elements, which may include active or passive circuit and/or passive elements and routing for RF signals between the circuit elements. For example, Antenna-in-package (AiP) constructions use RF package assemblies to manufacture antenna arrays which may be used for example in wireless communication applications such as 5G, 6G and future telecommunication standards. Typically a printed circuit board includes a laminate or substrate with multiple metal layers, usually copper and is used to implement an antenna array which have conformal ground and signal connections which may include for example strip-lines or coaxial connections from each antenna feed point to one or more routing layers. The routing layers route the RF signals between the antennas and the other circuitry of the antenna system including the antenna array.

SUMMARY

Aspects of the disclosure are defined in the accompanying claims. In a first aspect, there is provided an RF package assembly comprising a stacked arrangement of a first substrate and a second substrate, the first substrate having a first substrate interface layer which comprises: a plurality of first substrate RF signal pads configured to transmit or receive an RF signal, and a plurality of first substrate ground pads; the second substrate having a second substrate interface layer which comprises: a plurality of second substrate RF signal pads configured to transmit or receive an RF signal, and a plurality of second substrate ground pads; wherein the RF package assembly further comprises: an interface region between the first substrate and the second substrate, the interface region comprising: a plurality of galvanic connection regions providing a galvanic connection between the plurality of first substrate ground pads and the plurality of second substrate ground pads, and a plurality of dielectric regions between the plurality of first substrate RF signal pads and the plurality of second substrate RF signal pads.

In one or more embodiments, the RF package assembly may be configured to capacitively couple an RF signal transmitted between the first substrate and the second substrate via a respective one of the plurality of the first substrate RF signal pads and a respective one of the plurality of the second substrate RF signal pads.

In one or more embodiments, at least one of the plurality of first substrate RF signal pads and the plurality of second substrate RF signal pads may extends into the interface region.

In one or more embodiments, at least one of i) the plurality of first substrate RF signal pads and ii) the plurality of second substrate RF signal pads may further comprise a further metal region having the same metal as the respective first substrate interface layer and the second substrate interface layer.

In one or more embodiments the first substrate RF signal pads may be thicker than the first substrate ground pads.

In one or more embodiments the second substrate RF signal pads may be thicker than the second substrate ground pads.

In one or more embodiments a dielectric material in the plurality of dielectric regions may comprise air.

In one or more embodiments a dielectric region of the plurality of dielectric regions defines a minimum separation between the first substrate RF signal pads and the second substrate RF signal pads. In some examples, the minimum separation may be less than 10 microns.

In one or more embodiments, each of the plurality of galvanic connection regions may comprise a solder connection between the first substrate ground pads and the second substrate ground pads.

One or more embodiments of the RF package assembly may be included in an antenna-in-package the first substrate may further comprise an antenna array layer comprising an array of patch antennas; and wherein the plurality of first substrate RF signal pads are coupled to respective patch antennas of the antenna array.

In a second aspect, there is provided a method of manufacturing an RF package assembly comprising a stacked arrangement of a first substrate and a second substrate, the method comprising: providing a first substrate having a first substrate interface layer comprising: a plurality of first substrate RF signal pads configured to transmit or receive an RF signal, and a plurality of first substrate ground pads; providing a second substrate having a second substrate interface layer comprising: a plurality of second substrate RF signal pads, and a plurality of second substrate ground pads; and forming an interface region between the first substrate and the second substrate by: forming a plurality of galvanic connection regions connecting the plurality of first substrate ground pads and the plurality of second substrate ground pads; and forming a plurality of dielectric regions between the plurality of first substrate RF signal pads and the plurality of second substrate RF signal pads.

In one or more embodiments, forming a plurality of galvanic connection regions to connect the plurality of first substrate ground pads and the plurality of second substrate ground pads may further comprise: creating solder connections for the plurality of first substrate ground pads, and applying at least one of solder and anisotropic conductive paste to the plurality of second substrate ground pads.

In one or more embodiments, forming a plurality of galvanic connection regions to connect the plurality of first substrate ground pads and the plurality of second substrate ground pads further comprises: creating solder connections for the plurality of second substrate ground pads, and applying at least one of solder and anisotropic conductive paste to the plurality of first substrate ground pads.

In one or more embodiments, forming a plurality of dielectric regions between the plurality of first substrate RF signal pads and the plurality of second substrate RF signal pads may further comprise: forming an additional metal layer for the plurality of first substrate RF signal pads, and aligning and connecting the first substrate to the second substrate.

In one or more embodiments, forming a plurality of dielectric regions between the plurality of first substrate RF signal pads and the plurality of second substrate RF signal pads may further comprise forming an additional metal layer for the plurality of second substrate RF signal pads; and aligning and connecting the first substrate to the second substrate.

In a third aspect, there is provided an antenna-in-package package assembly comprising a stacked arrangement of a first substrate and a second substrate, the first substrate comprising a an antenna array layer comprising a patch antenna, and a first substrate interface layer which comprises: a first substrate RF signal pad coupled to the patch antenna, and a first substrate ground pad; the second substrate having a second substrate interface layer comprising: a second substrate RF signal pad, and a second substrate ground pad; wherein the antenna-in-package package assembly further comprises an interface region between the first substrate and the second substrate, the interface region configured and arranged to galvanically connect the first substrate ground pad to the second substrate ground pad, and further configured to capacitively couple an RF signal transmitted between the first substrate and the second substrate via the first substrate RF signal pad and the second substrate RF signal pad.

In one or more embodiments, the interface region may further comprise: a galvanic connection region providing a galvanic connection between the first substrate ground pad and the second substrate ground pad; and a dielectric region between the first substrate RF signal pad and the second substrate RF signal pad.

In one or more embodiments, at least one of the first substrate RF signal pad and the second substrate RF signal pad may extend into the interface region.

In one or more embodiments, at least one of the first substrate RF signal pad and the second substrate RF signal pad may further comprise a further metal region having a same metal as the respective first substrate interface layer and the second substrate interface layer.

In one or more embodiments, the dielectric in the dielectric region may comprise air.

BRIEF DESCRIPTION OF THE DRAWINGS

Embodiments are now described in detail, by way of example only, illustrated by the accompanying drawings in which.

Figure 1:
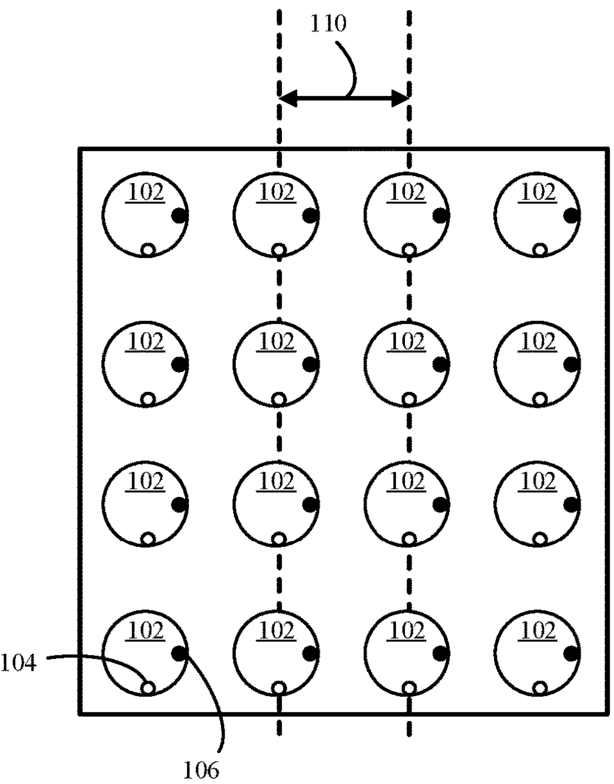
FIG. 1 shows an example 16 element dual-polarization antenna array.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

DETAILED DESCRIPTION OF EMBODIMENTS

FIG. 1 shows an antenna array 100 including sixteen antenna elements 102 which as illustrated are dual-polarisation patch antennas. Each of the antennas 102 has a first feed-point 104 and a second feed-point 106 corresponding to a horizontal polarization and vertical polarization. The antenna array 100 may be used for example for 100 GHz 6G applications, in which case the distance 110 between the antennas 102 may be for example 1.5 mm. For 100 GHz applications, the antenna array 100 may be implemented as an antenna in package (AiP). Multiple layers are typically required to route signals to and from the antennas 102. As a result, the accumulated thickness of the package stack causes internal mechanical stresses and warpage, which may affect the package assembly process and product reliability.

Package-on-Package is a construction technique which may reduce this risk by splitting the antenna-in-package into a separate routing laminate package and antenna laminate package. An example package-on package implementation of an antenna-in-package 150 of the antenna array 100 is shown in cross-section in FIG. 2.

The antenna laminate package 120 which may also be referred to as an antenna substrate includes a metal layer 112 which is typically copper (Cu) including the patch antenna 102 together with the first and second feed-points 104, 106. The antenna substrate 120 may have an interface metal layer 122 on the opposite major surface of the antenna substrate 120 to the antenna 102. The antenna interface metal layer 122 may include RF signal pads 108 which are connected to the respective feed-points 104, 106 for example by a via 114. The antenna interface layer 122 also has ground pads 116 which together with the RF signal connection form a conformal (co-axial) connection from the respective antenna feed-points 104, 106.

The routing laminate package 130 which may also be referred to as a routing substrate includes a routing metal layer 128. The routing substrate 130 may have an interface metal layer 126 which is patterned with RF signal connection pads 134 also referred to as signal lands and ground connection pads 136 complementary to the RF signal connection pads 108 and ground connection pads 116 of the antenna substrate 120. The RF signal connections 134 and ground connections may be connected to routing connections 138 in the routing layer 128 by vias 132.

The antenna-in-package 150 also includes an interface region 118 which includes for example solder bumps 124 with or without under bump metallization (UBM) formed for all the connections which may initially be formed either on the antenna interface layer 122 or the routing interface layer 126 before the antenna substrate 120 and the routing substrate 130 are connected together. After soldering, the interface region 118 galvanically connects the RF signal connection pads 108 and ground connection pads 116 of the antenna substrate 120 to the corresponding RF signal connection pads 134 and ground connection pads 136 of the routing substrate 130.

It will be appreciated that in other examples, both the antenna substrate 120 and the routing substrate 130 may include more metal layers than those illustrated. The metal layers are typically formed using copper.

Because a typical connection between the two substrates is made by a solder connection such as a copper core connection, this may introduce extra losses and variation in the RF-path and limits path isolation. In addition because of the package-on-package construction of the antenna in package 150, underfilling may be required because of the small dimension of the solder connections. For example the diameter of the RF signal connection pads 134 may be less than 60 microns. Due to the number of connections needed and their small feature-sizes the connection made in the interface region 118 typically involves small solder-bumps 124 or alternatively Cu-pillars with the need to underfill after reflow. The bumping, reflow and underfilling and curing also add process steps in assembly.

Figure 3:
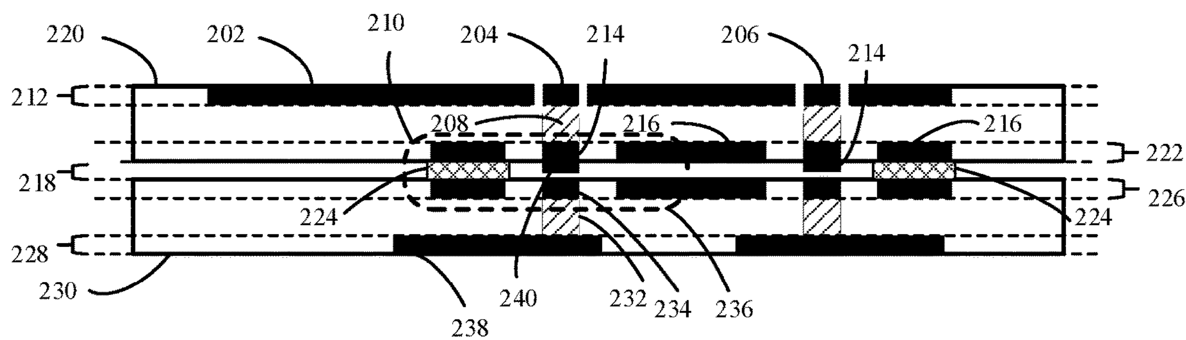
FIG. 3 shows a cross-section of an antenna-in-package according to an embodiment.
Figure 4:
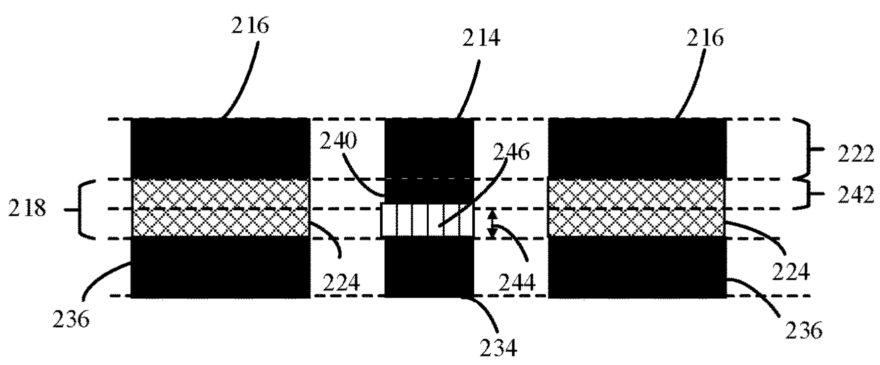
FIG. 4 illustrates a portion of the antenna-in-package of FIG. 3 showing the conformal interconnection between the two laminates.

FIG. 3 shows an antenna-in-package 200 cross-section view according to an embodiment and FIG. 4 shows a portion of the antenna-in-package of FIG. 3 showing the conformal ground and signal interconnection 210 between the two laminates.

Figure 2:
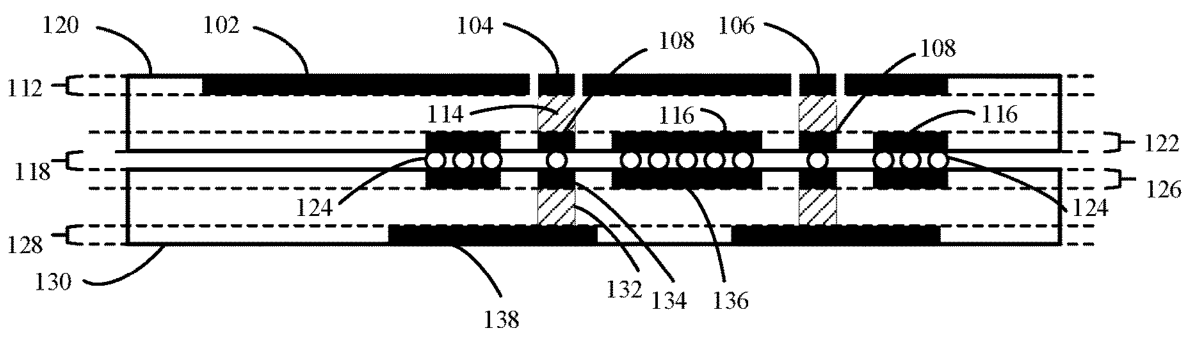
FIG. 2 illustrates an example antenna-in-package which may be used to implement the antenna array of FIG. 1.

An example package-on package implementation of an antenna-in-package 200 according to an embodiment is shown in cross-section in FIG. 2.

The antenna laminate package 220 which may also be referred to as an antenna substrate includes a metal layer 212 which may also be referred to as the antenna metal layer which is typically uses copper (Cu) including the patch antenna 202 together with the first and second feed-points 204, 206. The antenna substrate 220 may have an interface metal layer 222 on the opposite major surface of the antenna substrate 220 to the antenna 102. The antenna interface metal layer 222 may include RF signal pads 214 which are connected to the respective feed-points 204, 206 for example by vias 208. The antenna interface layer 222 also has ground pads 216 which together with the RF signal connection form a conformal connection from the respective antenna feed-points 204, 206. In other examples, antennas may have fewer or more feedpoints.

The routing laminate package 230 which may also be referred to as a routing substrate includes a routing metal layer 228. The routing substrate 230 may have an interface metal layer 226 which is patterned with RF signal connection pads 234 also referred to as signal lands and ground connection pads 236 complementary to the RF signal connection pads 214 and ground connection pads 216 of the antenna substrate 220. The RF signal pads 234 and ground pads may be connected to routing connections 238 in the routing layer 228 by vias 232.

The antenna-in-package 200 also includes an interface region 118 which includes a galvanic connection region 224 to interconnect the ground pads 216, 236 of the substrates 220, 230.

It will be appreciated that in other examples, both the antenna substrate 220 and the routing substrate 230 may include more metal layers than those illustrated. The metal layers are typically formed using copper.

The RF signal pads 214 of the antenna-in-package 200 includes an additional metal region 240 formed within the interface region 218. The additional metal region 240 may be formed by plating an additional metal layer 242 of the same material, for example copper, as the other metal layers 212, 222 formed in or on the antenna substrate 220. This additional metal region 240 is formed before the galvanic connection regions 224, which are formed only on the non RF signal pads. For example, as illustrated the galvanic connection regions 224 are formed on the ground connections 216 but may also be formed on other non-RF connections. No solder is applied to the RF signal pads 214 and so when the antenna substrate 220 and the routing substrate 230 are soldered together, there may be a gap 244 between the additional metal region 240 of the RF signal pads 216 of the antenna substrate 220. The gap 244 defines a dielectric region 246 between the RF signal pads 214, 234 and may in some examples be less than 10 microns. In other examples the gap 244 may be in a range of 1-3 microns.

In some examples this gap 244 may be an air gap. In other examples this gap 244 may be filled with another dielectric material. In contrast to the antenna-in-package 200, while the connection of the ground is still a galvanic connection, the connection for the RF signal is made by capacitive coupling. Due to field fringing at the air tip the RF signal is coupled for example from the antenna substrate 220 to the routing substrate 230. Because of the RF signal frequencies which may for example be greater than 60 GHz, and up to 200 GHz, by capacitively coupling the RF signal between antenna substrate 220 and the routing substrate 230, the RF signal losses compared to the soldered galvanic connections across the interface may be reduced. Furthermore, since there will be always field fringing across the interface the placing tolerance may be increased.

Figure 5:
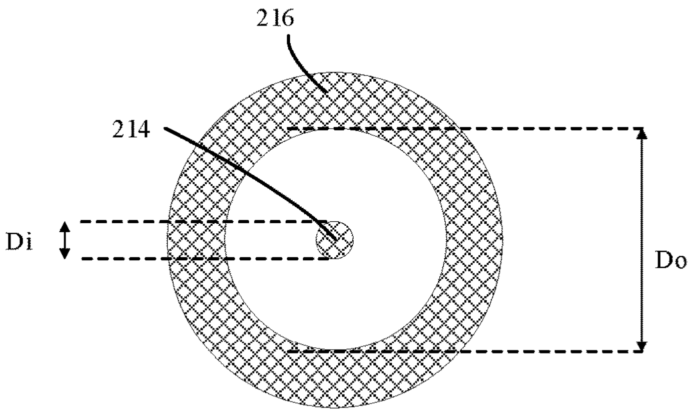
FIG. 5 show a plan view of the conformal ground and RF signal connections of FIG. 3.

FIG. 5 shows a plan view 210' of the conformal ground and signal interconnection 210. As illustrated, plan view 210' shows a coaxial connection, but in other examples, alternative conformal signal and ground connections may be used. The diameter Di of the signal connection 214 and the outer diameter Do of the laminate material or other dielectric separating the signal pad 214, and ground pad may vary dependent on the required frequencies. For example, assuming a dielectric constant of 4, a value of Di=30 microns (μm) and Do=160 μm may result in a connection with cut off frequency of 500 GHz, whereas for a value of Di=90 μm and Do=480 μm, the cut off frequency may be 170 GHz. Hence for high density conformal connections for high frequency RF signals, a smaller signal diameter, for example Di<60 μm may be required.

Figure 6:
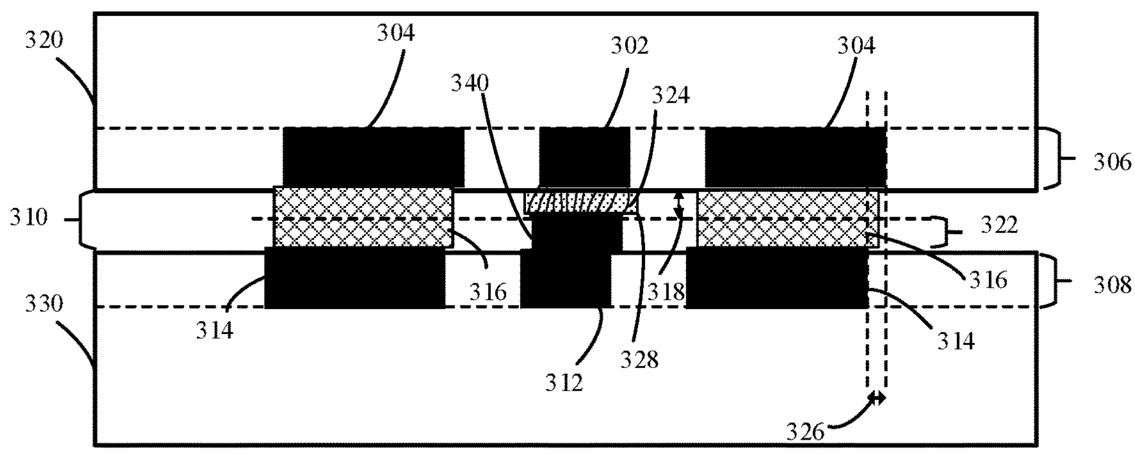
FIG. 6 shows a cross-section of a RF package assembly including conformal RF signal and ground interconnection according to an embodiment.

FIG. 6 shows an RF package assembly 300 including a conformal signal and ground interconnect according to an embodiment. A first substrate or laminate 320 includes an interface metal layer 306. The interface metal layer 306 includes RF signal pads 302 which are connected to other circuit elements (not shown) mounted on the substrate and/or other metal layers (not shown). The interface layer 306 also has ground pads 304 which together with the RF signal pads 302 form a conformal (co-axial) arrangement.

A second substrate or laminate 330 may have an interface metal layer 308 which is patterned with RF signal connection pads 312 also referred to as signal lands and ground connection pads 314 complementary to the RF signal connection pads 302 and ground connection pads 304 of the first substrate 320. The RF signal connections 312 and ground connections 314 may be connected to other metal layers (not shown) in the second substrate 330.

The RF package assembly 300 also includes an interface region 310 between the first substrate 230 and the second substrate 330. An additional metal layer 322 on the second substrate 330 may be provided to form an additional metal region 340 on the RF signal pads 312 of the second substrate. The interface region 310 may also include interface connections 316 galvanically connecting the ground pads 304, 314. These interface connections 316 may include but are not limited to for example solder, nanowire and anisotropic conductive paste (ACP) with or without under bump metallization (UBM) or solder bumps formed on either the first substrate 320 or the second substrate 330.

The interface region 310 includes a gap 318 between the RF signal pads 302, 312. This gap defines a dielectric region 328 between RF signal pads 302, 312 which may be an air gap or may be filled with another dielectric. The RF pads 302, 312 and dielectric effectively form a capacitor. In operation, RF signals transmitted between the first substrate 320 and the second substrate will be capacitively coupled. The additional metal region 340 may reduce the spacing between the RF signal pads 302, 312 but in some examples this may be omitted. The distance of the gap may be variable below a certain maximum distance to provide a large enough capacitance for the RF signal to be coupled without significantly attenuating the signal i.e. providing a low impedance path. This may allow for greater tolerance of the thickness of the interface region 310 during manufacture. The capacitive coupling of the RF signals and resulting fringing fields 324 may allow for a greater tolerance 326 in alignment of the first substrate 320 and the routing substrate 330 and also the alignment of the additional metal region 340 in metal layer 322 with the RF signal pads 312.

Figure 7:
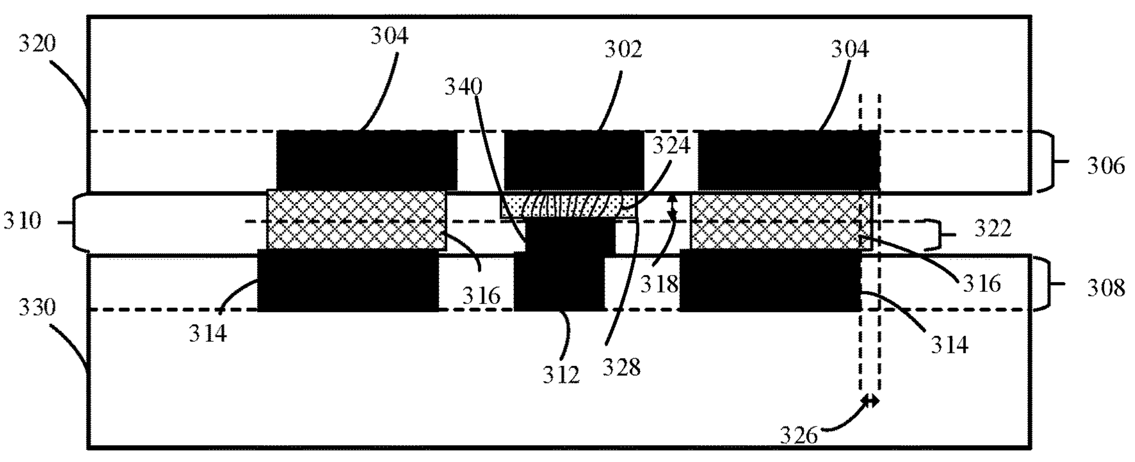
FIG. 7 shows a cross-section of a RF package assembly including conformal RF signal and ground interconnection according to an embodiment.

In some examples, the dimensions of the different RF signal pads 302, 312 may be different. This is illustrated in FIG. 7 which shows an a RF package assembly 300' including a conformal interconnect having a wider RF signal pad 302 than RF signal pad 312. In other respects RF package assembly 300' is similar to RF package assembly 300.

Figure 8:
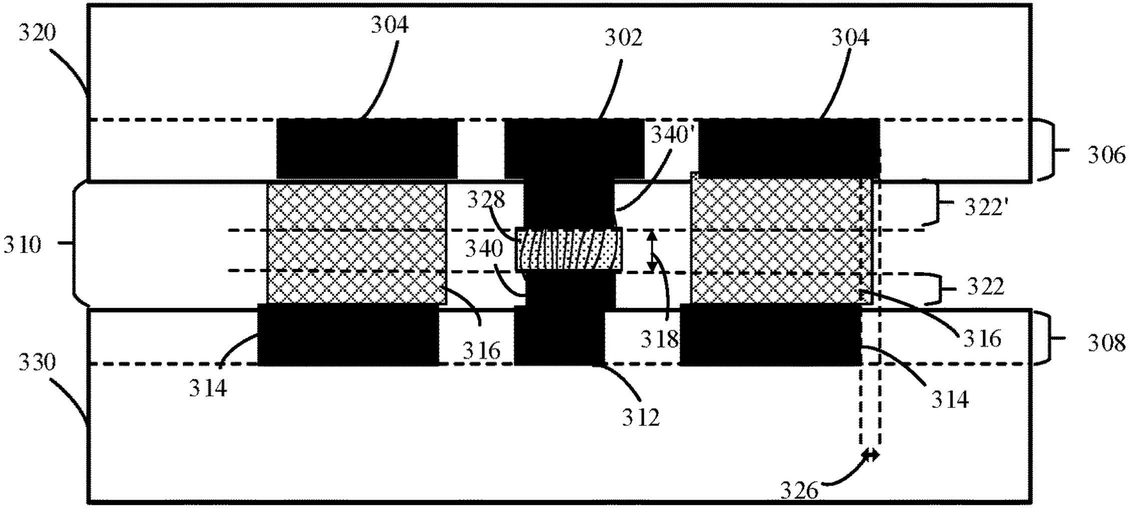
FIG. 8 shows a cross-section of a RF package assembly including conformal RF signal and ground interconnection according to an embodiment.

In some examples, an additional metal layer can be added to the RF signal pads on both the first substrate 320 and the second substrate 330. This is illustrated for example in FIG. 8 which shows an RF package assembly 300". Additional metal layers 242, 322' are provided to form additional metal regions 340,340' on the RF signal pads 312, 302 of both the first substrate 320 and second substrate 330. In other respects the RF package assembly 300 is similar to the RF package assemblies 300, 300'.

RF package assemblies 300, 300', 300" may allow additional metal regions 340, 340' to be formed for example using copper which can be grown or plated on either or both substrates 320, 330 to capacitively couple RF signals between the substrate packages 320, 330. Embodiments described herein may be less sensitive to processing spread of the metal pads and allow different dimensions of pads to be used in the substrates 320, 330 in any dimension (x, y, z) while still allowing the RF signals to be transmitted between the substrates 120, 130. The additional metal regions 340, 340' form thicker RF signal pads or lands 302, 312 (i.e., have a larger dimension when viewed in cross-section of the RF package assemblies 300, 300', 300") which are thicker on one or both substrates 320, 330 than the corresponding ground connections 304, 314.

Figure 9A:
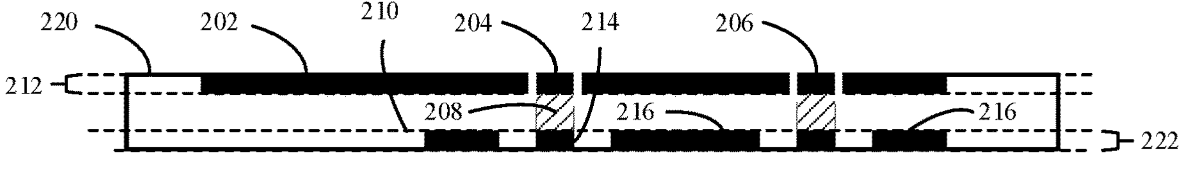
FIGS. 9A-9E illustrates an example sequence for manufacturing the antenna-in-package of FIG. 3.
Figure 9B:
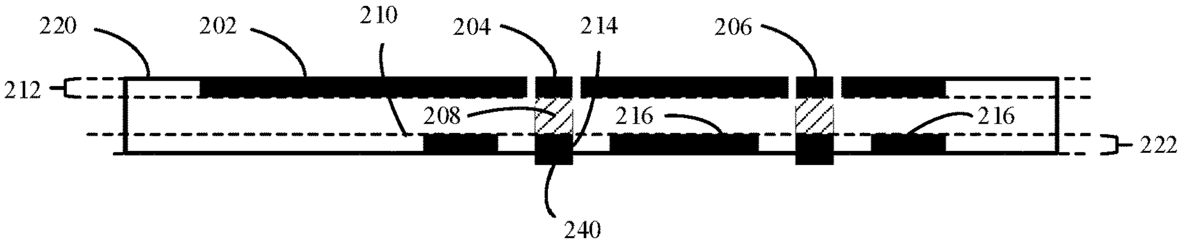
Figure 9C:
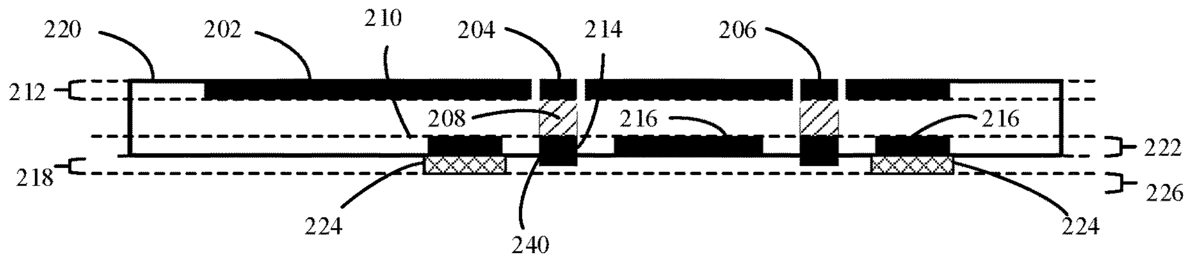
Figure 9D:
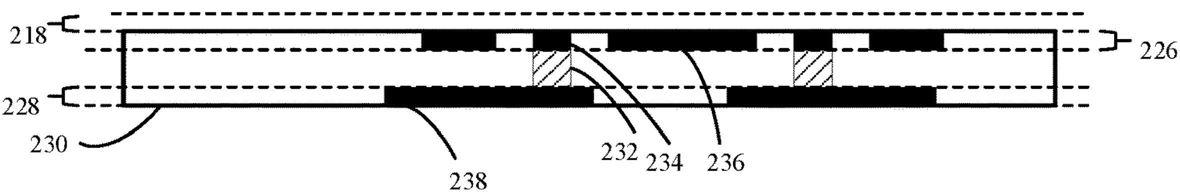
Figure 9E:
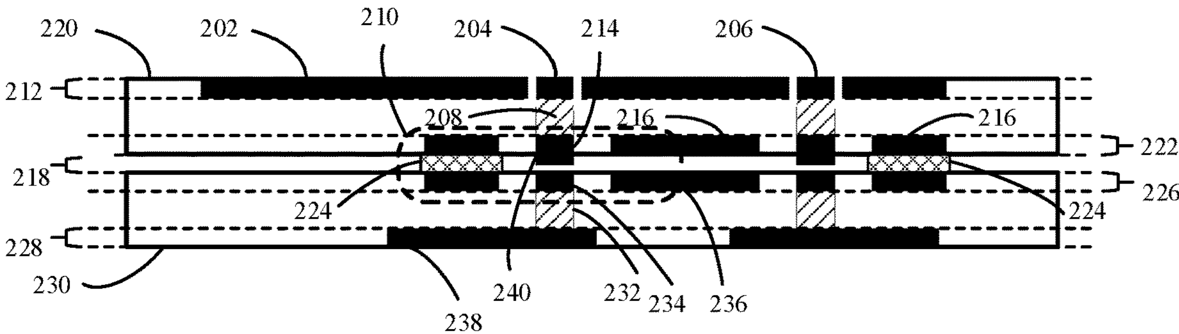
Figure 10:
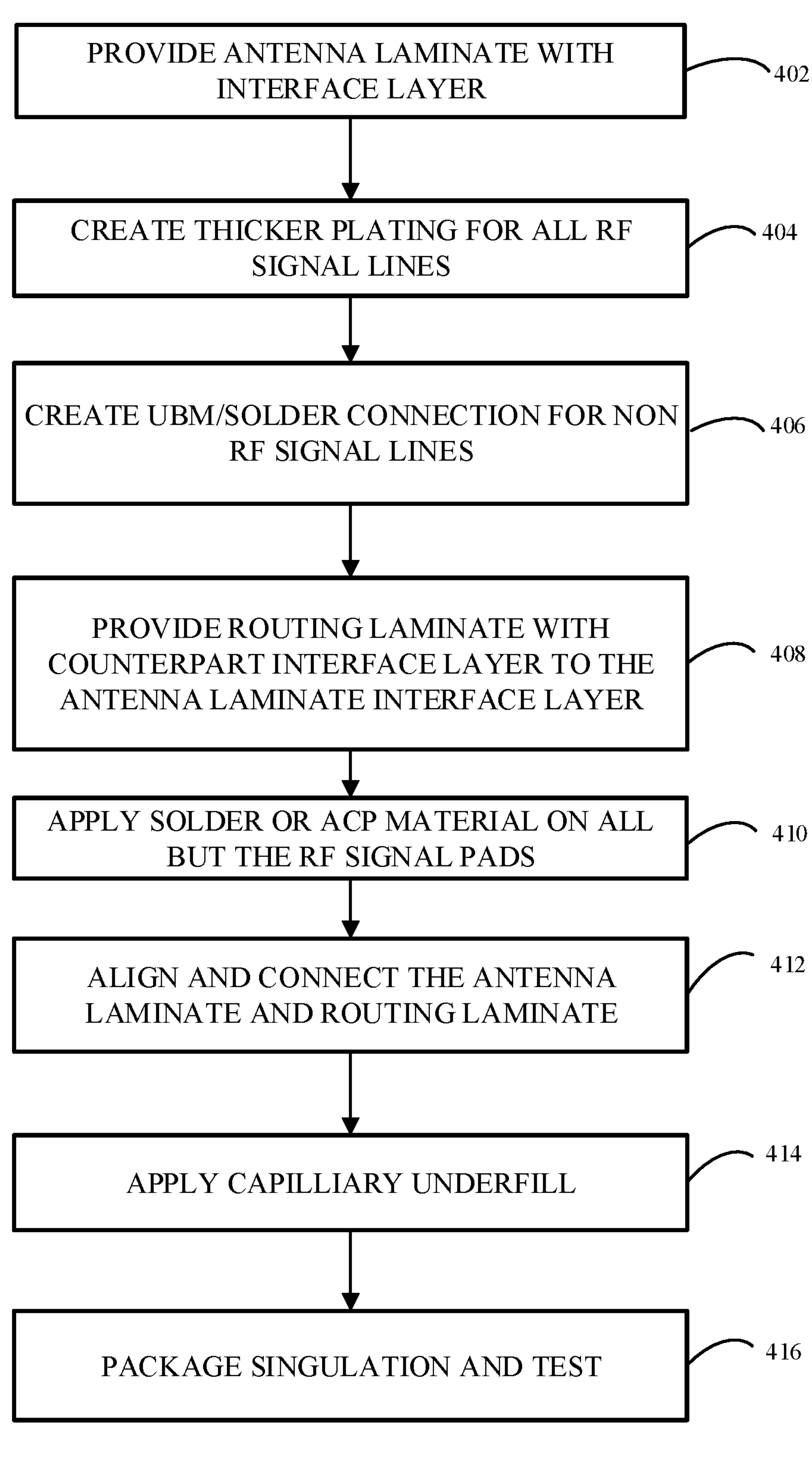
FIG. 10 shows a method of manufacturing a conformal signal and ground interconnect between two laminates for an antenna-in-package according to an embodiment.

FIGS. 9A-9E illustrate some of the processing steps to form antenna-in-package 200. FIG. 10 illustrates a method of manufacturing an antenna-in-package 400 according to an embodiment. In step 402, an antenna laminate with interface layer may be provided, for example antenna substrate 220 with metal layer 222 as illustrated in FIG. 9A. In step 404, thicker plating may be created for RF signal lines, for example, metal regions 240 as illustrated in FIG. 9B. In step 406, UBM/solder connections may be created for all non-RF signal lines, forming a galvanic connection region illustrated in FIG. 9C. In step 408, a routing laminate may be provided with a counterpart interface layer to the antenna laminate interface layer, for example routing substrate 130 with interface layer 126 illustrated in FIG. 9D. In step 410 solder or ACP material may be applied on all but the RF signal pads. The resulting ground and/or other connection layers will pull and keep the two laminates 220, 230 together, creating a minimal gap for the RF signal pads which may allow them to create a capacitive coupling. In step 412 the antenna laminate and the routing laminate may be aligned and connected, resulting for example in the antenna-in-package 200 shown in FIG. 9E. In step 414, capillary underfill may be applied and in step 416 the packages may be singulated and tested.

Embodiments of the RF packaging assembly and methods may replace a solder/intermetal galvanic interface for RF signals by an interface using capacitive coupling. The ground signal ground (GSG) connections may have multiple individual pads or ground ring around a central signal via. The connection of the ground between the antenna laminate and the routing laminate is galvanic, whereas the connection for the signal is made by capacitive coupling. Due to field fringing at the air tip the RF signal is coupled into the second package. Since there will be always field fringing the required accuracy of the manufacturing (placing) tolerance may be relaxed.

Embodiments may be used in antenna in package arrays with high density coaxial or other conformal ground and signal interconnections between two laminates in a package-on-package structure where the signal connection is small for example less than 60 microns. A smaller signal diameter Di<60 um may be needed for high density coax interconnections in high frequency applications (>50 GHz) for example 6G between two packages. On at least one of the interface layers of the laminates which may also be referred to as substrates, a dedicated plating structure is used which enables capacitive coupling. A patterned second plating on at least one of the interface layers may be included improve the performance of the non-galvanic connection on the signal path of the conformal signal and ground in high density substrate to substrate (which may also be referred to as board-to-board or laminate-to-laminate) connections.

An RF package assembly includes a stacked package-on-package arrangement of a first substrate and a second substrate. Each of the first and second substrates include RF signal pads and ground pads. An interface region between the stacked substrates couples the RF signal pads and ground pads of the first substrate to corresponding pads of the second substrate. The interface region includes galvanic connection regions providing a galvanic connection between the each of the first substrate ground pads and each of the corresponding second substrate ground pads. The interface region includes dielectric regions between each of the first substrate RF signal pads and the corresponding second substrate RF signal pads so that RF signals transmitted between the two substrates are capacitively coupled.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A radio frequency (RF) package assembly comprising a stacked arrangement of a first substrate and a second substrate, wherein:

the first substrate has a first substrate interface layer which includes a plurality of first substrate RF signal pads configured to transmit or receive an RF signal, and a plurality of first substrate ground pads;

the second substrate has a second substrate interface layer which includes a plurality of second substrate RF signal pads configured to transmit or receive an RF signal, and a plurality of second substrate ground pads;

additional metal regions on at least one of the plurality of first substrate RF signal pads and the plurality of second substrate RF signal pads; and the RF package assembly further includes an interface region between the first substrate and the second substrate, wherein the interface region includes a plurality of galvanic connection regions providing a galvanic connection between the plurality of first substrate ground pads and the plurality of second substrate ground pads, and a plurality of dielectric regions in a plurality of gaps between the plurality of first substrate RF signal pads and the plurality of second substrate RF signal pads.

2. The RF package assembly of claim 1, wherein the RF package assembly is configured to capacitively couple an RF signal transmitted between the first substrate and the second substrate via a respective one of the plurality of the first substrate RF signal pads and a respective one of the plurality of the second substrate RF signal pads.

3. The RF package assembly of claim 1, wherein at least one of the plurality of first substrate RF signal pads and the plurality of second substrate RF signal pads extends into the interface region.

4. The RF package assembly of claim 3 wherein the additional metal regions include a same metal as the respective first substrate interface layer.

5. The RF package assembly of claim 1, wherein the additional metal regions are on the first substrate RF signal pads, the additional metal regions are not on the first substrate ground pads, and the first substrate RF signal pads with the additional metal regions are thicker than the first substrate ground pads.

6. The RF package assembly of claim 1, wherein the additional metal regions are on the second substrate RF signal pads, the additional metal regions are not on the second substrate ground pads, and the second substrate RF signal pads with the additional metal regions are thicker than the second substrate ground pads.

7. The RF package assembly of claim 1, wherein a dielectric material in the plurality of dielectric regions comprises air.

8. The RF package assembly of claim 1, wherein a dielectric region of the plurality of dielectric regions defines a minimum separation between the first substrate RF signal pads and the second substrate RF signal pads.

9. The RF package assembly of claim 1, wherein each of the plurality of galvanic connection regions comprises a solder connection between the first substrate ground pads and the second substrate ground pads.

10. An antenna-in-package comprising:

a radio frequency (RF) package assembly that includes a stacked arrangement of a first substrate and a second substrate, wherein the first substrate has a first substrate interface layer which includes a plurality of first substrate RF signal pads configured to transmit or receive an RF signal, a plurality of first substrate ground pads, and an antenna array layer comprising an array of patch antennas, wherein the plurality of first substrate RF signal pads are coupled to respective patch antennas of the array of patch antennas;

the second substrate has a second substrate interface layer which includes a plurality of second substrate RF signal pads configured to transmit or receive an RF signal, and a plurality of second substrate ground pads; and the RF package assembly further includes an interface region between the first substrate and the second substrate, wherein the interface region includes additional metal regions on at least one of the plurality of first substrate RF signal pads and the plurality of second substrate RF signal pads, a plurality of galvanic connection regions providing a galvanic connection between the plurality of first substrate ground pads and the plurality of second substrate ground pads, and a plurality of dielectric regions in a plurality of gaps between the plurality of first substrate RF signal pads and the plurality of second substrate RF signal pads.

11. A method of manufacturing an RF package assembly comprising a stacked arrangement of a first substrate and a second substrate, the method comprising:

providing the first substrate having a first substrate interface layer that includes a plurality of first substrate RF signal pads configured to transmit or receive an RF signal, and a plurality of first substrate ground pads;

providing the second substrate having a second substrate interface layer that includes a plurality of second substrate RF signal pads, and a plurality of second substrate ground pads; and forming an interface region between the first substrate and the second substrate by forming additional metal regions on at least one of the plurality of first substrate RF signal pads and the plurality of second substrate RF signal pads, forming a plurality of galvanic connection regions connecting the plurality of first substrate ground pads and the plurality of second substrate ground pads, and forming a plurality of dielectric regions in a plurality of gaps between the plurality of first substrate RF signal pads and the plurality of second substrate RF signal pads.

12. The method of claim 11, wherein forming a plurality of galvanic connection regions to connect the plurality of first substrate ground pads and the plurality of second substrate ground pads comprises:

creating solder connections for the plurality of first substrate ground pads; and applying at least one of solder and anisotropic conductive paste to the plurality of second substrate ground pads.

13. The method of claim 11, wherein forming a plurality of galvanic connection regions to connect the plurality of first substrate ground pads and the plurality of second substrate ground pads comprises:

creating solder connections for the plurality of second substrate ground pads; and applying at least one of solder and anisotropic conductive paste to the plurality of first substrate ground pads.

14. The method of claim 11, wherein forming the additional metal regions on at least one of the plurality of first substrate RF signal pads and the plurality of second substrate RF signal pads comprises:

forming an additional metal layer for the plurality of first substrate RF signal pads; and aligning and connecting the first substrate to the second substrate.

15. The method of claim 11, wherein forming the additional metal regions on at least one of the plurality of first substrate RF signal pads and the plurality of second substrate RF signal pads comprises:

forming an additional metal layer for the plurality of second substrate RF signal pads; and aligning and connecting the first substrate to the second substrate.

16. An antenna-in-package package assembly comprising a stacked arrangement of a first substrate and a second substrate, wherein:

the first substrate includes an antenna array layer with a patch antenna, and a first substrate interface layer which includes a first substrate RF signal pad coupled to the patch antenna, and a first substrate ground pad;

the second substrate includes a second substrate interface layer which includes a second substrate RF signal pad, and a second substrate ground pad; and the antenna-in-package package assembly further includes at least one additional metal region on at least one of the first substrate RF signal pad and the second substrate RF signal pad, and an interface region between the first substrate and the second substrate, the interface region configured and arranged to galvanically connect the first substrate ground pad to the second substrate ground pad, and further configured to capacitively couple an RF signal transmitted between the first substrate and the second substrate across a plurality of gaps between the first substrate RF signal pad and the second substrate RF signal pad.

17. The antenna-in-package package assembly of claim 16 wherein the interface region further comprises:

a galvanic connection region providing a galvanic connection between the first substrate ground pad and the second substrate ground pad; and a dielectric region between the first substrate RF signal pad and the second substrate RF signal pad.

18. The antenna-in-package package assembly of claim 17, wherein a dielectric in the dielectric region comprises air.

19. The antenna-in-package package assembly of claim 16, wherein at least one of the first substrate RF signal pad and the second substrate RF signal pad extends into the interface region.

20. The antenna-in-package package assembly of claim 19, wherein the at least one additional metal region includes a same metal as the respective first substrate interface layer and the second substrate interface layer.

* * * * *